United States Patent
Ito

(10) Patent No.: US 7,864,602 B2
(45) Date of Patent: Jan. 4, 2011

(54) NON-VOLATILE SEMICONDUCTOR STORAGE DEVICE AND METHOD OF WRITING DATA THERETO

(75) Inventor: Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 12/428,010

(22) Filed: Apr. 22, 2009

(65) Prior Publication Data

US 2009/0285041 A1 Nov. 19, 2009

(30) Foreign Application Priority Data

May 14, 2008 (JP) .............................. 2008-127253

(51) Int. Cl.
*G11C 7/00* (2006.01)
(52) U.S. Cl. .................. 365/189.16; 365/100; 365/148; 365/225.7
(58) Field of Classification Search .................. 365/100
See application file for complete search history.

(56) References Cited

U.S. PATENT DOCUMENTS

| | | | |
|---|---|---|---|
| 5,448,187 A * | 9/1995 | Kowalski | 326/81 |
| 5,844,298 A * | 12/1998 | Smith et al. | 257/530 |
| 6,525,955 B1 * | 2/2003 | Smith et al. | 365/96 |
| 6,775,197 B2 * | 8/2004 | Novosel et al. | 365/225.7 |
| 7,345,903 B2 | 3/2008 | Nakano et al. | |
| 2007/0103224 A1 | 5/2007 | Namekawa et al. | |
| 2008/0049485 A1 | 2/2008 | Matsufuji et al. | |
| 2008/0246535 A1 | 10/2008 | Namekawa et al. | |

OTHER PUBLICATIONS

Kensuke Matsufuji, et al., "A 65nm Pure CMOS One-time Programmable Memory Using a Two-Port Antifuse Cell Implemented in a Matrix Structure", IEEE Asian Solid-State Circuits Conference, Nov. 12-14, 2007; Jeju, Korea; pp. 212-215.

* cited by examiner

*Primary Examiner*—Tan T. Nguyen
(74) *Attorney, Agent, or Firm*—Oblon, Spivak, McClelland, Maier & Neustadt, L.L.P.

(57) ABSTRACT

A non-volatile semiconductor storage device includes: a plurality of memory cells storing information based on a change in resistance value; and a plurality of first and second wirings connected to the plurality of memory cells and activated in reading data from and writing data to a certain one of the memory cells. Each of the memory cells includes: an irreversible storage element storing information based on a change in resistance value associated with breakdown of an insulation film; and a voltage booster circuit receiving an input of a voltage-boost clock performing clock operation in writing data to a certain one of the memory cells and applying a voltage-boosted signal boosted based on the voltage-boost clock to one end of the irreversible storage element.

14 Claims, 4 Drawing Sheets

NON-VOLATILE SEMICONDUCTOR STORAGE DEVICE AND METHOD OF WRITING DATA THERETO

CROSS-REFERENCE TO RELATED APPLICATIONS

This application is based upon and claims the benefit of priority from the prior Japanese Patent Application No. 2008-127253, filed on May 14, 2008, the entire contents of which are incorporated herein by reference.

BACKGROUND OF THE INVENTION

1. Field of the Invention

The present invention relates to an electrically readable and writable non-volatile semiconductor storage device and a method of writing data thereto.

2. Description of the Related Art

Non-volatile OTP (One-Time Programmable) memory has been an essential element in semiconductor integrated circuits where the stored data is not lost even when the power is turned off. The OTP memory has been widely used for adding redundancy in mass storage memory such as DRAM (Dynamic Random Access Memory) or SRAM (Static Random Access Memory); for tuning of analog circuits: for storing codes such as encryption keys: for storing chip IDs such as history and management information in manufacturing process; and the like.

For memory redundancy applications, laser-fuse ROM (Read Only Memory) with laser fuses has been used as a cheapest non-volatile memory where information is stored in an irreversible manner through laser beam blowing of the fuses. The laser fuse ROM requires a specially-designed fuse-blow machine and the associated blowing process, which involves necessary test costs. In addition, since the minimum dimension of a laser fuse ROM is determined by the wavelength of the laser beam in use, the laser fuse ROM does not keep in step with refinement of other circuit parts, causing a gradual increase in the percentage of its occupation area. Further, the laser fuse ROM can be programmed only at wafer level due to its programming method, and hence cannot be used for recovery from failure in high-speed test after packaging, Built-in Self Repair (BISR) by a test circuit mounted in the chip, and so on.

In addition, there are demands in systems with laser fuse ROM for mounting a electrically-programmable non-volatile memory. In this case, systems including multiple chips may store various types of information in independent EEPROMs (Electrically Erasable Programmable Read Only Memory) chip. However, the SoC (System on Chip) where systems are integrated on one chip must also have a non-volatile memory therein. Consolidation of non-volatile memory that stores charges in a floating gate would require additional masks and associated processes, causing an increase in cost. Information such as memory redundancy information that is stored in a non-volatile memory needs not necessarily be rewritten many times. Therefore, there are great demands for OTP memory, because it can be formed by currently-available standard CMOS process.

Those storage elements used in the OTP memory that store information by changing their element characteristics in an irreversible manner are collectively referred to hereinafter as "fuse elements". In addition, among these, those elements are collectively referred to as "eFuses (Electrical Fuses)" that electrically change their element characteristics in an irreversible manner. One of the eFuses that can be used in standard CMOS process includes a "Gate-Ox eFuse" that utilizes the decrease in resistance by formation of a conduction spot due to dielectric breakdown caused by applying high voltage to a gate insulation film of a MOSFET. Those fuse elements are referred to as "antifuses" that become high-resistance state during non-programmed state and low-resistance state after being programmed. It is herein defined that "0" data is stored in an antifuse in high-resistance state before programming, while "1" data being stored in low-resistance state after programming, respectively. An example of conventional OTP memory with such antifuses is disclosed in Non-Patent Document 1 (A 65 nm Pure CMOS One-time Programmable Memory Using a Two-Port Antifuse Cell Implemented in a Matrix Structure", pp. 211-215, IEEE Asian Solid-State Circuits Conference 2007). In Non-Patent Document 1, a gate insulation film of a p-type MOSFET is used as an antifuse and a high-voltage power supply circuit for programming is arranged external to a memory array.

However, the above-mentioned antifuse suffers from a larger high-voltage stress on each memory cell if there is any leakage in a memory cell (decrease in voltage of a node) or the fluctuation of the supply voltage. This leakage is caused by: high-temperature condition; and decrease in threshold voltage due to the manufacturing variation. In addition, the total amount of time for writing increases due to an increase in number of bits to be written at one time, the stress application time also increases for non-selected cells. This situation where both the strength and application time of such high voltage stress increases may degrade the gate insulation film of the non-selected cell, to which "1" data could be incorrectly written accordingly. Although some memory cells can pass the final test before shipment depending upon the degree of degradation, they may fail during actual use due to the secular change, posing a serious problem concerning the reliability.

SUMMARY OF THE INVENTION

One aspect of the present invention provides a non-volatile semiconductor storage device comprising a plurality of memory cells storing information based on a change in resistance value, and a plurality of first and second wirings connected to the plurality of memory cells and activated in reading data from and writing data to a certain one of the memory cells, each of the memory cells comprising: an irreversible storage element storing information based on a change in resistance value associated with breakdown of an insulation film; and a voltage booster circuit receiving an input of a voltage-boost clock performing clock operation in writing data to a certain one of the memory cells and applying a voltage-boosted signal boosted based on the voltage-boost clock to one end of the irreversible storage element.

Another aspect of the present invention provides a method of writing data to a non-volatile semiconductor storage device comprising a plurality of memory cells storing information based on a change in resistance value, and a plurality of first and second wirings connected to the plurality of memory cells and activated in reading data from and writing data to a certain one of the memory cells, each of the memory cells comprising: an irreversible storage element storing information based on a change in resistance value associated with breakdown of an insulation film; and a voltage booster circuit receiving an input of a voltage-boost clock performing clock operation and applying a voltage-boosted signal boosted based on the voltage-boost clock to one end of the irreversible storage element, the method comprising, inputting the voltage-boost clock to the voltage booster circuit in writing data to a certain one of the memory cells.

DETAILED DESCRIPTION OF THE EMBODIMENTS

Embodiments of a non-volatile semiconductor storage device according to the present invention will now be described below with reference to the accompanying drawings.

First Embodiment (Configuration of Non-Volatile Semiconductor Storage Device 100 in First Embodiment)

Figure 1:
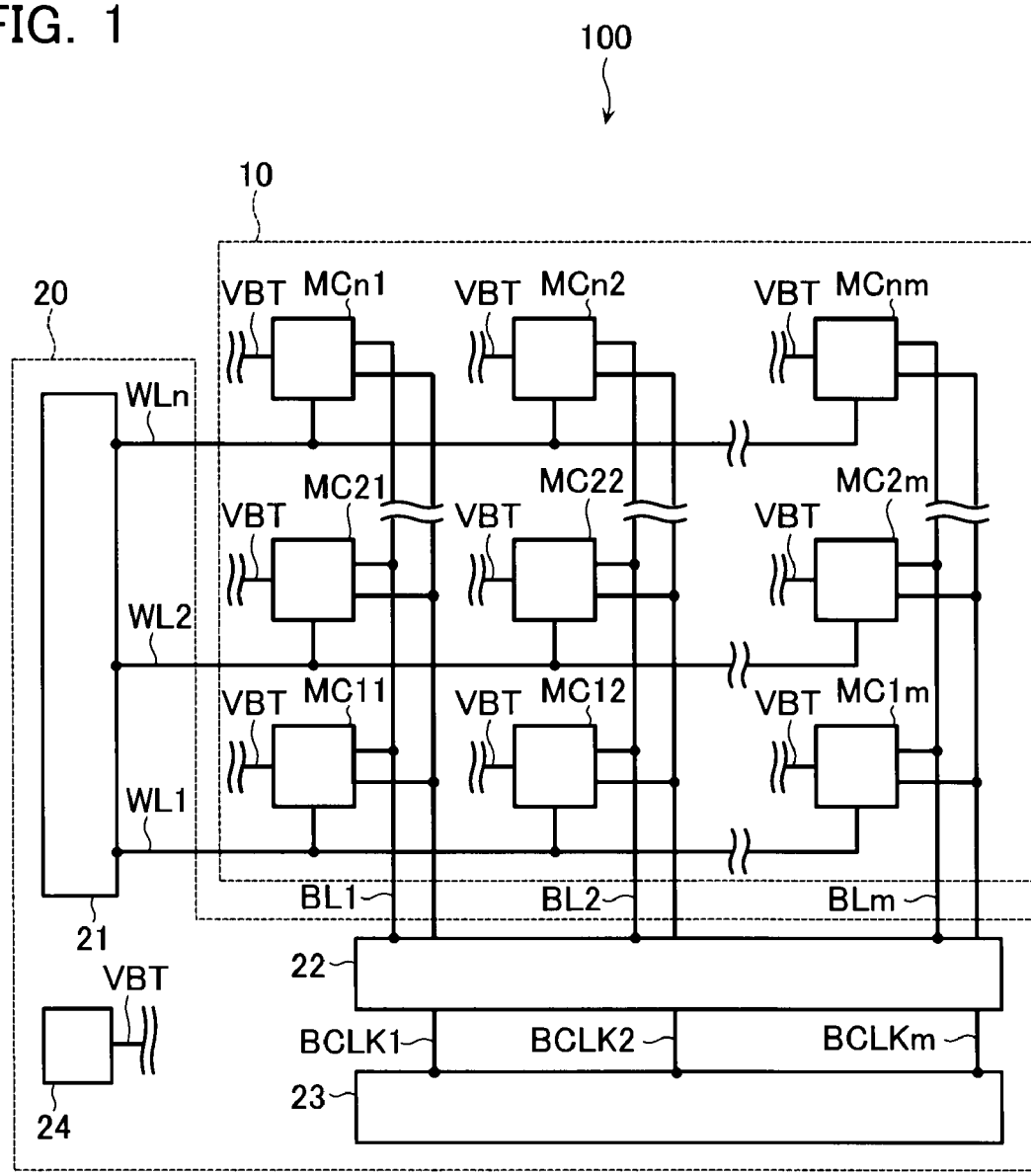
FIG. 1 is a schematic configuration diagram of a non-volatile semiconductor storage device 100 according to a first embodiment of the present invention.

FIG. 1 schematically illustrates a non-volatile semiconductor storage device 100 according to a first embodiment of the present invention. As illustrated in FIG. 1, the non-volatile semiconductor storage device 100 according to the first embodiment mainly comprises a memory cell array 10 and a control circuit 20. The memory cell array 10 has a plurality of memory cells MC11 to MCnm (where n and m are integers not less than 2) arranged in a grid (matrix) pattern. The control circuit 20 controls voltage applied to the memory cells MC11 to MCnm.

The memory cell array 10 is connected to the control circuit 20 via a plurality of word lines (first wirings) WL1 to WLn extending in the row direction. The memory cell array 10 is connected to the control circuit 20 via a plurality of first bit lines (second wirings) BL1 to BLm extending in the column direction and a plurality of second bit lines BCLK1 to BCLKm extending in the column direction. In addition, the memory cell array 10 is supplied with VBT-voltage VBT from the control circuit 20.

In this case, the word lines WL1 to WLn and the first bit lines BL1 to BLm are activated in reading data from and writing data to certain memory cells MC11 to MCnm. In addition, voltage-boost clocks VBCLK1 to VBCLKm are applied to the second bit lines BCLK1 to BCLKm in writing data.

Figure 2:
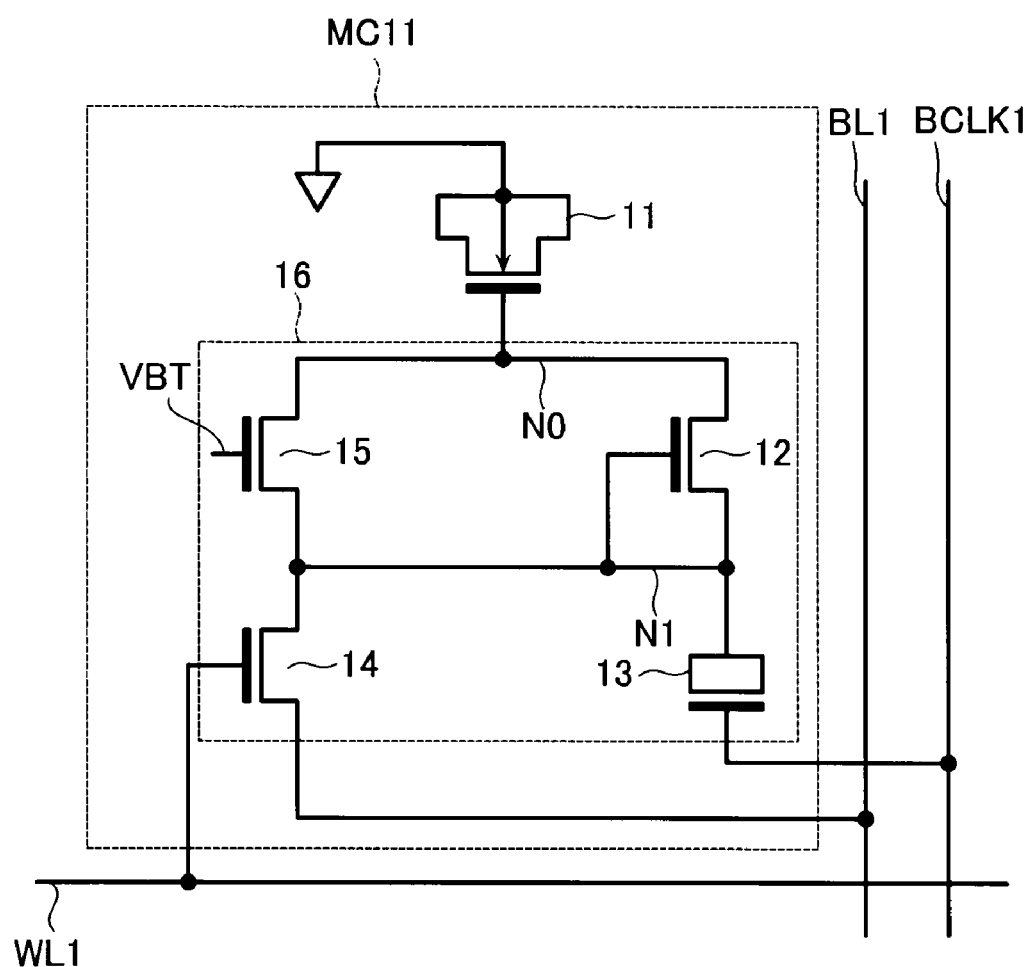
FIG. 2 is a schematic configuration diagram of a memory cell MC11 of the first embodiment.

FIG. 2 is a schematic configuration diagram of a memory cell MC11 included in the memory cell array 10. Note that the other memory cells MC12 to MCnm also have a similar configuration to the memory cell MC11.

As illustrated in FIG. 2, the memory cell MC11 has an antifuse (irreversible storage element) 11, a transistor (switch) 12, a capacitor 13, a transistor 14, and a transistor 15.

The antifuse 11 is a storage element that stores information based on a change in resistance value associated with breakdown of an insulation film. The antifuse 11 includes an n-type MOSFET. That is, the antifuse 11 has a drain, a source, and a gate, which drain and source are short-circuited. As described below, one end of the antifuse 11 is connected to one end of the transistor 12 and to the other end of the transistor 15. The other end of the antifuse 11 is connected to the ground.

The transistor 12 includes source and gate connected each other at a common node. This transistor 12 only applies electrical current to the drain from the source, has a commutation function as a diode. The one end (drain-side) of the transistor 12 is connected to the one end of the antifuse 11.

The capacitor 13 is a MOS capacitor that includes, for example, an n-type MOSFET. One end of the capacitor 13 is connected to the other end of the transistor 12. The other end of the capacitor 13 is connected to the second bit line BCLK1.

The transistor 14 includes an n-type MOSFET. One end of the transistor 14 is connected to the other end of the transistor 12 and to the one end of the capacitor 13. The other end of the transistor 14 is connected to the first bit line BL1. The transistor 14 has a gate connected to the word line WL1.

The transistor 15 includes an n-type MOSFET. One end of the transistor 15 is connected to the one end of the transistor 14. The other end of the transistor 15 is connected to the one end of the antifuse 11. The transistor 15 has a gate to which VBT-voltage VBT is applied from a VBT generation circuit 24.

According to the embodiment with the above-mentioned configuration, one wiring represents a "first internal node N0" that connects one end of the antifuse 11 to the other end of the transistor 15 and the one end of the transistor 12. In addition, another wiring represents a "second internal node N1" that connects the other end of the transistor 12 to the one end of the capacitor 13 and the one end of the transistor 14 (the one end of the transistor 15).

In this configuration, the transistor 12, the capacitor 13, the transistor 14, and the transistor 15 together function as a charge pump circuit (a voltage booster circuit) 16 that performs a voltage boosting operation using charge and discharge of a capacitor. The charge pump circuit 16 generates a high voltage for programming with respect to the antifuse 11. The charge pump circuit 16 receives inputs of voltage-boost clocks VBCLK1 to VBCLKm that provide clock operation in writing data to a certain memory cell MC11, and applies a voltage-boosted signal that is boosted based on the voltage-boost clocks VBCLK1 to VBCLKm to the one end of the antifuse 11.

Referring again to FIG. 1, a configuration of the control circuit 20 will be described below. As illustrated in FIG. 1, the control circuit 20 has a row decoder circuit 21, a data input/output circuit 22, a clock driving circuit 23, and a VBT generation circuit 24.

The row decoder circuit 21 receives an address signal and selectively increases word-line voltages VWL1 to VWLn (e.g., to 3.3V) to be applied to any of the word lines WL1 to WLn based on the address signal.

The data input/output block 22 receives inputs of write and read signals and selectively increases first bit-line voltages VBL1 to VBLm (e.g., to 3.3V) to be applied to any of the first bit lines BL1 to BLm based on the write and read signals. The data input/output block 22 amplifies and outputs the read signal through the first bit lines BL1 to BLm.

The clock driving circuit 23 selectively applies voltage-boost clocks VBCLK1 to VBCLKm in clock pulse to any of the second bit lines BCLK1 to BCLKm. The voltage-boost clocks VBCLK1 to VBCLKm change between "0V" and "3.3V" at a predetermined period.

The VBT generation circuit 24 generates VBT-voltage VBT (e.g., 1.2V). In addition, the VBT generation circuit 24 supplies the VBT-voltage VBT to the gate of the transistor 15.

(Write Operation in Non-Volatile Semiconductor Storage Device 100 in First Embodiment)

Figure 3:
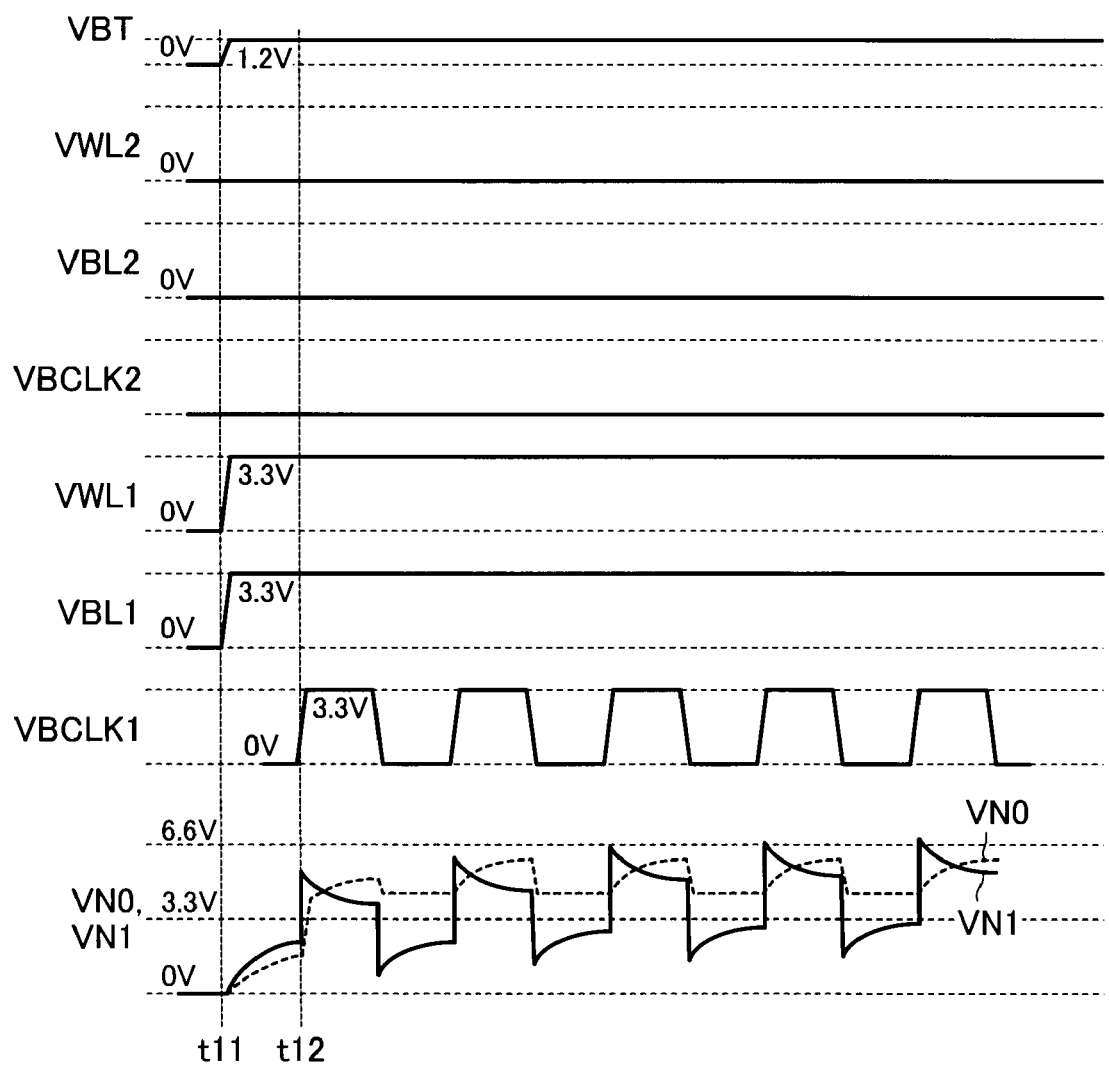
FIG. 3 illustrates a write operation in the non-volatile semiconductor storage device 100 according to the first embodiment.

Referring now to FIG. 3, a write operation in the non-volatile semiconductor storage device 100 according to the first embodiment will be described below. FIG. 3 illustrates a time chart of a write operation in the non-volatile semiconductor storage device according to the first embodiment. As illustrated in FIG. 3, the following write operation assumes that data is written only to the memory cell MC11 (i.e., "1" is programmed) and not to the other memory cells MC12 to MCnm.

Prior to performing the write operation, VBT-voltage VBT is set to "0V". Similarly, word-line voltages VWL1 to VWLn are set to "0V". First bit-line voltages VBL1 to VBLm are set to "0V". Voltage boosting clocks VBCLK1 to VBCLKm are held at "0V".

As illustrated in FIG. 3, the VBT generation circuit 24 first increases the VBT-voltage VBT from "0V" to "1.2V" at time t11. Similarly, at time t11, the row decoder circuit 21 increases the word-line voltage VWL1 applied to the word line WL1 from "0V" to "3.3V". In like manner, at time t11, the data input/output circuit 22 increases the first bit-line voltage VBL1 applied to the first bit line BL1 from "0V" to "3.3V". As described above, the VBT-voltage VBT is set at a voltage sufficiently lower than 3.3V. Thereby, non-volatile semiconductor storage device 100 can suppress a reverse current flowing to the node N1 from the node N0, and reduce a stress at the gate insulation film of the transistor 15. Alternatively, at time t11, the VBT-voltage VBT may be kept at 0V.

Then, at time t12, the clock driving circuit 23 initiates clock operation of a clock-pulsed voltage-boost clock VBCLK1 for the second bit line BCLK1.

Through this operation, as illustrated in FIG. 3, a first node voltage VN0 applied to the first internal node N0 in the memory cell MC11 and a second node voltage VN1 applied to the second internal node N1 are varying up and down repeatedly and boosted by the charge pump circuit 16. The first node voltage VN0 and the second node voltage VN1 are eventually boosted to between not less than 3.3V and less than 6.6V. That is, in other words, a voltage-boosted signal that is boosted (to not less than 3.3V and less than 6.6V) based on the voltage-boost clock VBCLK1 is applied to the one end of the antifuse 11 (the first node N0) by the charge pump circuit 16.

In this case, for example, if the transistor 12 and the capacitor 13 have ideal characteristics, the first node voltage VN0 and the second node voltage VN1 are boosted to 6.6V.

When the first internal node voltage VN0 keeps its boosted state, breakdown is caused in the insulation film of the antifuse 11 in the memory cell MC11, forming a path to the ground (0V). As a result, the write operation is performed with respect to the memory cell MC11.

In this case, in the memory cells MC12 to MC1n, while the word-line voltage VWL1 applied to the word line WL1 is "3.3V", the first bit-line voltages VBL2 to VBLm applied to the first bit lines BL2 to BLm and the voltage-boost clocks VBCLK2 to VBCLKm applied to the second bit lines BCLK2 to BCLKm are held at "0V". Thus, the second internal node voltage VN1 will not be boosted in the memory cells MC12 to MC1n.

In addition, in the memory cells MC21 to MCn1, while the first bit-line voltage VBL1 applied to the first bit line BL1 is "3.3V", and the voltage-boost clock VBCLK1 applied to the second bit line BCLK1 is clocking between "0V" and "3V", the word-line voltages VWL2 to VWLn applied to the word lines WL2 to WLn are "0V". Thus, all of the transistor 14 in the memory cells MC21 to MCn1 are in "off state (non-conductive state)". Thus, the second internal node voltage VN1 will not be boosted in the memory cells MC21 to MCn1.

In addition, in the memory cells MC22 to MCnm, the word-line voltages VWL2 to VWLn applied to the word lines WL2 to WLn, the first bit-line voltages VBL2 to VBLm applied to the first bit lines BL2 to BLm, and the voltage-boost clocks VBCLK2 to VBCLKm applied to the second bit lines BCLK2 to BCLKm are held at "0V". Thus, the second internal node voltage VN1 will not be boosted in the memory cells MC22 to MCnm.

That is, as can be seen from the above, the control circuit 20 may selectively write data (program "1" data) to the memory cells MC11 to MCnm by controlling the word lines WL1 to WLn, the first bit lines BL1 to BLm, and the second bit lines BCLK1 to BCLKm.

(Read Operation in Non-Volatile Semiconductor Storage Device 100 in First Embodiment)

Next, a read operation in the non-volatile semiconductor storage device 100 according to the first embodiment will be described below. Note that the following read operation assumes that data is read to memory cells MC11 to MC1m connected to one word line WL1. It is also assumed that "1" data is retained in the memory cell 11.

Prior to performing the read operation, VBT-voltage VBT is set to "0V". Similarly, word-line voltages VWL1 to VWLn are set to "0V". First bit-line voltages VBL1 to VBLm are set to "0V". Voltage boosting clocks VBCLK1 to VBCLKm are held at "0V".

The VBT generation circuit 24 first increases the VBT-voltage VBT from "0V" to "2.4V" In addition, at the same time, the data input/output circuit 22 increases the first bit-line voltages VBL1 to VBLm of the first bit lines BL1 to BLm from "0V" to "22.4V" to precharge the first bit lines BL1 to BLm.

Then, the row decoder circuit 21 increases the word-line voltage VWL1 applied to the word line WL1 from "0V" to "1.2V".

Through this process, current flows from the first bit line BL1 to the other end of the antifuse 11 (ground) in the programmed memory cell MC11. On the other hand, substantially no current flows from the first bit lines BL1 to BLm to the other end of the antifuse 11 (ground) in the non-programmed memory cells MC12 to MCnm.

The data input/output circuit 22 reads the absence or presence of that current flowing through the first bit lines BL1 to BLm as data "1"/"0".

(Advantages of Non-Volatile Semiconductor Storage Device 100 in First Embodiment)

Advantages of the non-volatile semiconductor storage device 100 according to the first embodiment will now be described below.

The non-volatile semiconductor storage device 100 according to the first embodiment provides a charge pump circuit 16 (including a transistor (switch) 12, a capacitor 13, a transistor 14, and a transistor 15) to generate a high voltage for programming for each of the different memory cells MC11 to MCnm. Thus, the non-volatile semiconductor storage device 100 according to the first embodiment may generate a high voltage (a voltage-boosted signal) only in the selected memory cells MC11 to MCnm using the charge pump circuit 16. Consequently, the non-volatile semiconductor storage device 100 according to the first embodiment may improve reliability without degradation of the antifuses in the non-selected memory cells that would conventionally be encountered.

In addition, in the non-volatile semiconductor storage device 100 according to the first embodiment, the antifuse 11 includes an n-type MOSFET. Thus, the antifuse 11 is broken down with a lower program voltage and in a shorter period of time as compared with other antifuses including a p-type MOSFET. That is, the non-volatile semiconductor storage device 100 according to the first embodiment may shorten its response time.

As can be seen from the above, the antifuse 11 includes an n-type MOSFET. Therefore, the antifuse 11 may reduce its area as compared with other antifuses including a p-type MOSFET, because it does not involve any area that would otherwise be required for a well isolation (formed in an N-well of the p-type substrate) that is provided at a p-type MOSFET.

Second Embodiment (Configuration of Non-Volatile Semiconductor Storage Device in Second Embodiment)

Figure 4:
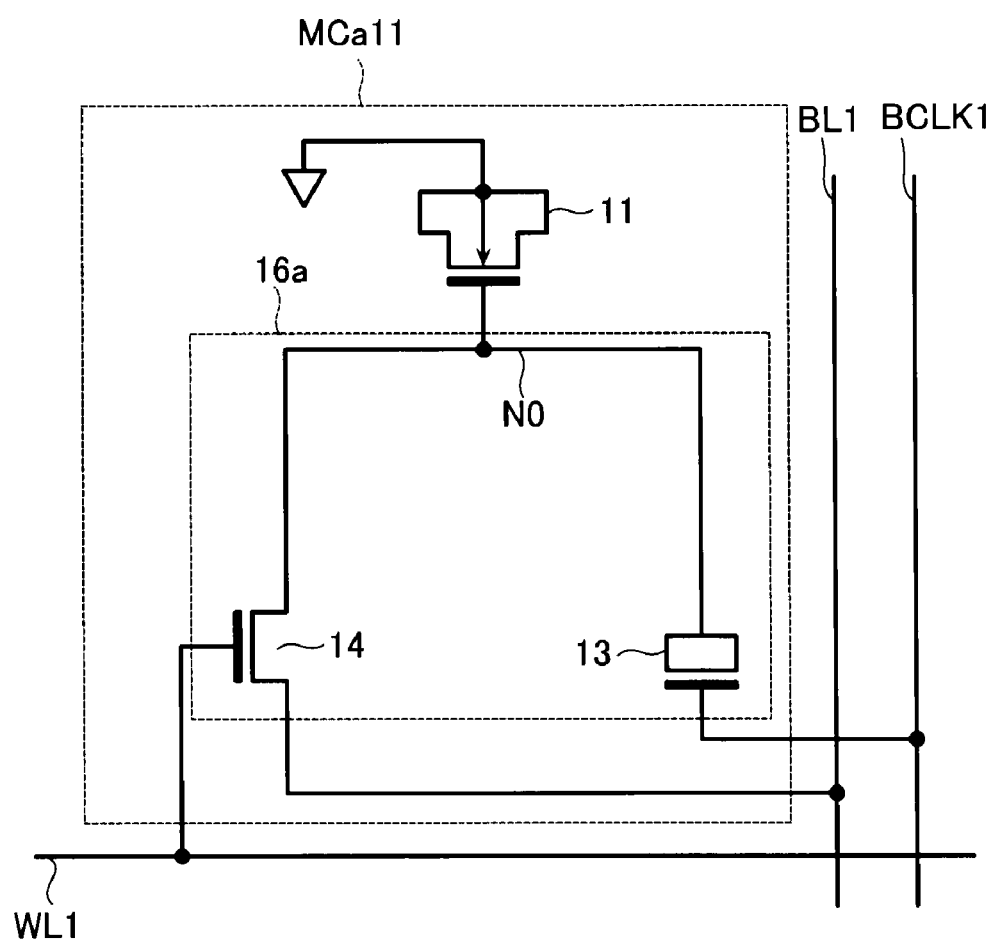
FIG. 4 is a schematic configuration diagram of a memory cell MCa11 in a non-volatile semiconductor storage device according to a second embodiment of the present invention.

Referring now to FIG. 4, a configuration of a non-volatile semiconductor storage device according to a second embodiment will be described below. FIG. 4 is a schematic configuration diagram illustrating a memory cell MCa11 included in the non-volatile semiconductor storage device according to the second embodiment. Note that the same reference numerals represent the same components as the first embodiment and description thereof will be omitted in the second embodiment.

The non-volatile semiconductor storage device according to the second embodiment comprises a plurality of memory cells MCa11 to MCanm different from the first embodiment.

As illustrated in FIG. 4, the memory cell MCa11 has such a configuration the transistor 12 and the transistor 15 in the first embodiment are omitted. That is, the one end of the antifuse 11 is directly connected to one end of the transistor 14, and one end of the capacitor 13. This also means that a charge pump circuit 16*a* according to the second embodiment has such a configuration the transistor 12 and the transistor 15 are omitted. Note that each memory cell MCa12 to MCanm has the same configuration as the memory cell MCa11.

(Write Operation in Non-Volatile Semiconductor Storage Device in Second Embodiment)

The non-volatile semiconductor storage device according to the second embodiment has such a configuration the transistor 12 and the transistor 15 in the first embodiment are omitted. Therefore, in the second embodiment, the antifuse 11 is applied high voltage only in a period that each of the voltage-boost clocks VBCLK1 to VBCLKm becomes upper state (3.3V). That is, a voltage waveform of the node N0 has the same wave form like "the second node voltage VN1" shown in the FIG. 3.

(Advantages of Non-Volatile Semiconductor Storage Device in Second Embodiment)

Advantages of the non-volatile semiconductor storage device according to the second embodiment will now be described below. The non-volatile semiconductor storage device according to the second embodiment has substantially the same configuration as the first embodiment. Therefore, the non-volatile semiconductor storage device according to the second embodiment has the same advantages as the first embodiment. Also, compared to the first embodiment, the number of devices configuring the memory cell is small in the second embodiment. Therefore, the non-volatile semiconductor storage device according to the second embodiment can reduce the area per the memory cell.

In addition, in the second embodiment, amount of time for programming is about double from the first embodiment, because above write operation is executed.

[Others]

While embodiments of the present invention have been described, the present invention is not intended to be limited to the disclosed embodiments and various other changes, additions, replacements or the like may be made thereto without departing from the spirit of the invention. For example, the non-volatile semiconductor storage device according to the present invention is not limited to the configuration where the other end of the antifuse 11 is connected to the ground. The other end of the antifuse 11 needs only to be set to a potential lower than that of the corresponding voltage-boosted signal.

What is claimed is:

1. A non-volatile semiconductor storage device comprising a plurality of memory cells storing information based on a change in resistance value, and a plurality of first and second wirings connected to the plurality of memory cells and activated in reading data from and writing data to a certain one of the memory cells, each of the memory cells comprising:
an irreversible storage element storing information based on a change in resistance value associated with breakdown of an insulation film; and
a voltage booster circuit receiving an input of a voltage-boost clock performing clock operation in writing data to a certain one of the memory cells and applying a voltage-boosted signal boosted based on the voltage-boost clock to one end of the irreversible storage element.

2. The non-volatile semiconductor storage device according to claim 1, wherein
the voltage booster circuit comprises:
a switch having one end connected to one end of the irreversible storage element; and
a capacitor having one end connected to the other end of the switch,
the switch is configured to transfer a charge only in a direction from the other end to one end of the switch, and
the other end of the capacitor is configured to receive the voltage-boost clock.

3. The non-volatile semiconductor storage device according to claim 2, wherein
the voltage booster circuit comprises:
a first transistor having its one end connected to the other end of the switch and to one end of the capacitor; and
a second transistor having its one end connected to one end of the irreversible storage element and the other end connected to one end of the first transistor,
the first transistor has a gate connected to corresponding one of the first wirings, and
the first transistor has the other end connected to corresponding one of the second wirings.

4. The non-volatile semiconductor storage device according to claim 2, comprising:
a control circuit activating, in writing data, a certain one of the first wirings and a certain one of the second wirings and applying the voltage-boost clock in clock pulse to the other end of a certain one of the capacitors.

5. The non-volatile semiconductor storage device according to claim 1, wherein
the voltage booster circuit comprises:
a capacitor having one end connected to the other end of the switch; and
a first transistor having one end connected to one end of the irreversible storage element, and the other end connected to corresponding one of the second wirings, and the gate of the first transistor is connected to corresponding one of the first wirings.

6. The non-volatile semiconductor storage device according to claim 1, wherein
the irreversible storage element includes an n-type MOSFET.

7. The non-volatile semiconductor storage device according to claim 1, wherein
the capacitor includes an n-type MOSFET.

8. A method of writing data to a non-volatile semiconductor storage device comprising a plurality of memory cells storing information based on a change in resistance value, and a plurality of first and second wirings connected to the plurality of memory cells and activated in reading data from and writing data to a certain one of the memory cells,
each of the memory cells comprising:
an irreversible storage element storing information based on a change in resistance value associated with breakdown of an insulation film; and
a voltage booster circuit receiving an input of a voltage-boost clock performing clock operation and applying a voltage-boosted signal boosted based on the voltage-boost clock to one end of the irreversible storage element,
the method comprising, inputting the voltage-boost clock to the voltage booster circuit in writing data to a certain one of the memory cells.

9. The method of writing data to the non-volatile semiconductor storage device according to claim 8, wherein
the voltage booster circuit comprises:
a switch having its one end connected to one end of the irreversible storage element; and
a capacitor having one end connected to the other end of the switch,
the switch is configured to transfer a charge only in a direction from the other end to one end of the switch, and
the other end of the capacitor is configured to receive the voltage-boost clock.

10. The method of writing data to the non-volatile semiconductor storage device according to claim 9, wherein
the voltage booster circuit comprises:
a first transistor having its one end connected to the other end of the switch and to one end of the capacitor; and
a second transistor having one end connected to one end of the irreversible storage element and the other end connected to one end of the first transistor,
the first transistor has a gate connected to corresponding one of the first wirings, and
the first transistor has the other end connected to corresponding one of the second wirings.

11. The method of writing data to the non-volatile semiconductor storage device according to claim 9, wherein
in writing data, a certain one of the first wirings and a certain one of the second wirings are activated and the voltage-boost clock in clock pulse is applied to the other end of a certain one of the capacitors.

12. The method of writing data to the non-volatile semiconductor storage device according to claim 8, wherein
the voltage booster circuit comprises:
a capacitor having one end connected to the other end of the switch; and
a first transistor having one end connected to one end of the irreversible storage element, and the other end connected to corresponding one of the second wirings, and
the gate of the first transistor is connected to corresponding one of the first wirings.

13. The method of writing data to the non-volatile semiconductor storage device according to claim 8, wherein
the irreversible storage element includes an n-type MOSFET.

14. The method of writing data to the non-volatile semiconductor storage device according to claim 8, wherein
the capacitor includes an n-type MOSFET.

* * * * *